United States Patent
Iacoponi et al.

[11] Patent Number: 6,080,669
[45] Date of Patent: Jun. 27, 2000

[54] SEMICONDUCTOR INTERCONNECT INTERFACE PROCESSING BY HIGH PRESSURE DEPOSITION

[75] Inventors: John A. Iacoponi, San Jose; Dirk Brown, Santa Clara; Takeshi Nogami, Sunnyvale, all of Calif.

[73] Assignee: Advanced Micro Devices, Inc., Sunnyvale, Calif.

[21] Appl. No.: 09/225,644

[22] Filed: Jan. 5, 1999

[51] Int. Cl.[7] ................................................. H01L 21/44
[52] U.S. Cl. ..................... 438/672; 438/642; 438/643; 438/656; 438/685; 427/531; 427/597
[58] Field of Search ................................ 427/531, 564, 427/576, 597; 117/92, 89, 103; 438/642, 643, 644, 648, 652, 654, 656, 685, 687, 688; 204/192.11, 192.17

[56] References Cited

U.S. PATENT DOCUMENTS

| | | | |
|---|---|---|---|
| 4,476,622 | 10/1984 | Cogan | 29/571 |
| 5,329,161 | 7/1994 | Vines et al. | 257/764 |
| 5,567,660 | 10/1996 | Chen et al. | 437/231 |
| 5,654,233 | 8/1997 | Yu | 438/643 |
| 5,764,563 | 6/1998 | Sur, Jr. et al. | 365/154 |
| 5,876,574 | 3/1999 | Hofmann et al. | 204/192.13 |
| 5,882,399 | 3/1999 | Ngan et al. | 117/89 |
| 5,913,145 | 6/1999 | Lu et al. | 438/643 |
| 5,920,790 | 6/1999 | Wetzel et al. | 438/618 |
| 5,925,225 | 7/1999 | Ngan et al. | 204/192.17 |
| 5,933,758 | 8/1999 | Jain | 438/687 |
| 5,976,327 | 11/1999 | Tanaka | 204/192.15 |

OTHER PUBLICATIONS

Stanley Wolf and Richard N. Tauber, Silicon Processing for the VLSI Era, vol. 1, Lattice Press, p. 173, 1986 no month.

*Primary Examiner*—Matthew Smith
*Assistant Examiner*—Robert A. Hullinger
*Attorney, Agent, or Firm*—Mikio Ishimaru

[57] ABSTRACT

A method is provided for forming metal layers in semiconductor channels or vias by using a very high pressure ionized metal deposition technique which results in improved sidewall step coverage with enhanced subsequent filling of the channel or vias by conductive materials. To obtain the very high pressure in excess of 100 mT, the plasma coil power is increased and the gas flow is increased while maintaining a constant pumping feed in the ionized metal deposition equipment.

18 Claims, 2 Drawing Sheets

SEMICONDUCTOR INTERCONNECT INTERFACE PROCESSING BY HIGH PRESSURE DEPOSITION

TECHNICAL FIELD

The present invention relates generally to semiconductors and more specifically to processing conductive/barrier/seed materials used in semiconductors.

BACKGROUND ART

In the process manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique starts with the placement of a first channel dielectric layer, which is typically an oxide layer, over the semiconductor devices. A first damascene step photoresist is then placed over the dielectric layer and is photolithographically processed to form the pattern of the first channels. An anisotropic dielectric etch is then used to etch out the channel dielectric layer to form the first channel openings. The damascene step photoresist is stripped and a barrier layer is deposited to coat the walls of the first channel opening to ensure good adhesion and to act as a barrier material to prevent diffusion of such conductive material into the dielectric layer and the semiconductor devices (the combination of the adhesion and barrier material is collectively referred to as "barrier layer" herein). A seed layer is then deposited on the barrier layer to coat the barrier layer and form a conductive material base, or "seed", for subsequent deposition of conductive material. A conductive material is deposited in the first channel openings to fill the opening and then is subjected to a chemical-mechanical polishing process which removes the material above the first channel dielectric layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel dielectric layer. Subsequently, a separating dielectric layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed dielectric in the via area of the via nitride. A second damascene step photoresist is placed over the second channel dielectric layer and is photolithographically processed to form the pattern of the second channels. An anisotropic dielectric etch is then used to etch the second channel dielectric layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), or titanium nitride (TiN) are used as barrier materials for copper.

Thus, a thin adhesion layer formed of an adhesion material, such as titanium, is first deposited on the dielectrics or vias to ensure good adhesion and good electrical contact of the subsequently deposited barrier layers to underlying doped regions and/or conductive channels. Barrier layer stacks formed of barrier materials such as tantalum/tantalum nitride (Ta/TaN) and titanium/titanium nitride (Ti/TiN) have been found to be useful as barrier material combination for copper interconnects.

The barrier and seed layers for copper interconnect in a damascene process are typically deposited by physical vapor deposition (PVD) or derivatives of PVD techniques. A popular method is ionized metal deposition which is performed at a low pressure, 20 millitorr (mT) to 100 mT, to maintain high ionization efficiency.

A common problem associated with most of these deposition techniques is poor sidewall step coverage. In effect, the layer thickness is much higher in wide-open areas, such as on top of the channel dielectric layer and in the upper portion of the sidewalls of the channels and vias than in the lower portion of the sidewalls of the channels and vias. To guarantee a required minimum layer thickness anywhere in the channel or vias, including at the lower portion of the sidewalls, the layer thickness in wide-open areas must be much higher. As the width of the channels and vias have decreased in size due to the size reduction in the semiconductor devices, an excessively thick layer in the wide-open areas interferes with the subsequent filling of the channel and vias with conductive materials.

A solution, which would provide better step coverage for layers in channel or vias and improve the subsequent filling of the channel or vias by conductive materials, has long been sought, but has eluded those skilled in the art. As the semiconductor industry is moving from aluminum to copper and other type of materials with greater electrical conductivity and thinner channels and vias, it is becoming more pressing that a solution be found.

DISCLOSURE OF THE INVENTION

The present invention provides a method for forming metal layers in semiconductor channels or vias by using a very high pressure ionized metal deposition technique which results in improved sidewall step coverage with enhanced subsequent filling of the channel or vias by conductive materials. To obtain the very high pressure in excess of 100 mT, the plasma coil power is increased and the gas flow is increased while maintaining a constant pumping feed in the ionized metal deposition equipment.

The present invention still further provides a method for forming barrier layers in channel or vias with improved step coverage.

The present invention still further provides a method for forming seed layers in channel or vias with improved step coverage.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
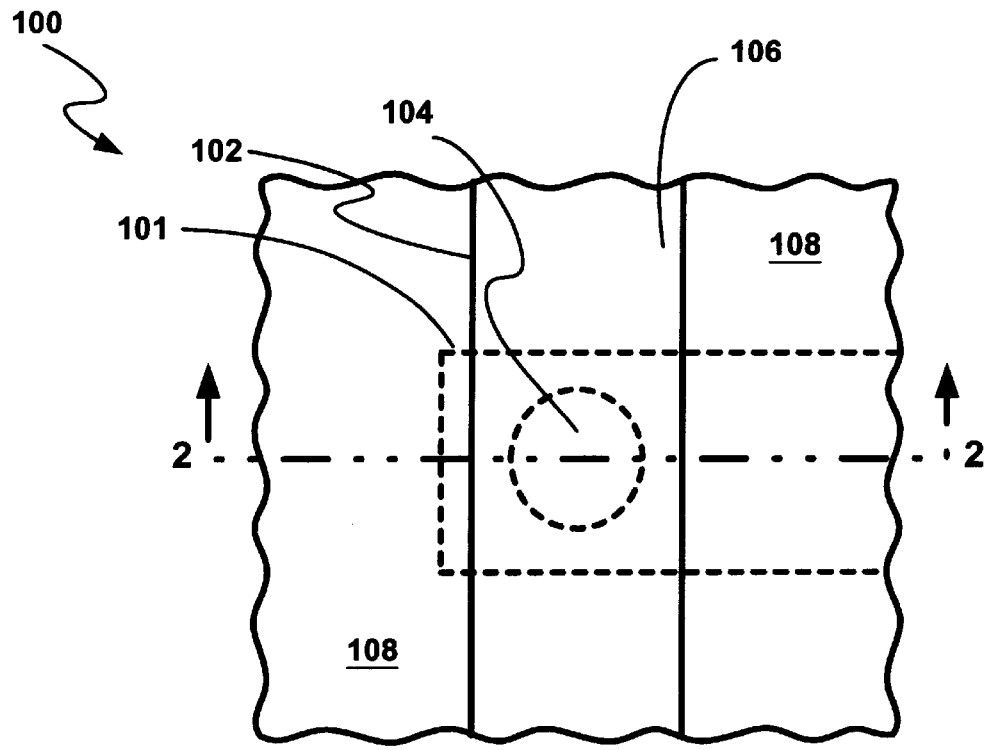
FIG. 1 (PRIOR ART) is a plan view of prior art perpendicularly aligned channels with a via.

Referring now to FIG. 1 (PRIOR ART), therein is shown a plan view of a prior art pair of perpendicularly aligned semiconductor channels of a conductive material such as copper or, aluminum disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel dielectric layer 108 with a second conductive material. The second channel opening 106 is defined by walls (sidewalls) 109 of second dielectric layer 108.

Figure 2:
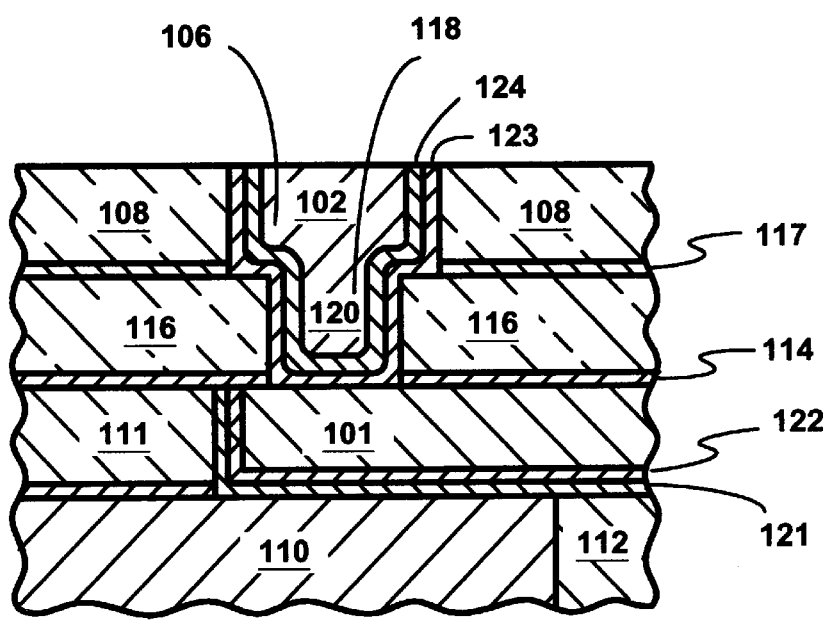
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed in a channel dielectric 111 over a polysilicon gate 110 and a dielectric 112 of a semiconductor device on an integrated circuit chip (not shown). The first and second channels 101 and 102 are in horizontal planes separated vertically by a stop nitride layer 114, a via dielectric layer 116, and a thin via nitride layer 117. The cross-sectional area of the round via 104 of FIG. 1 (PRIOR ART) defines a cylindrical via 120 when it is filled with the second conductive material.

Also shown disposed around the first channel 101 are an barrier layer 121 and seed layer 122, and around the second channel 102 and the cylindrical via 120 is an barrier layer 123 and seed layer 124. The barrier layers include barrier material combinations such as titanium/titanium nitride and tantalum/tantalum nitride for copper seed layers and copper or copper alloy conductive materials.

Figure 3:
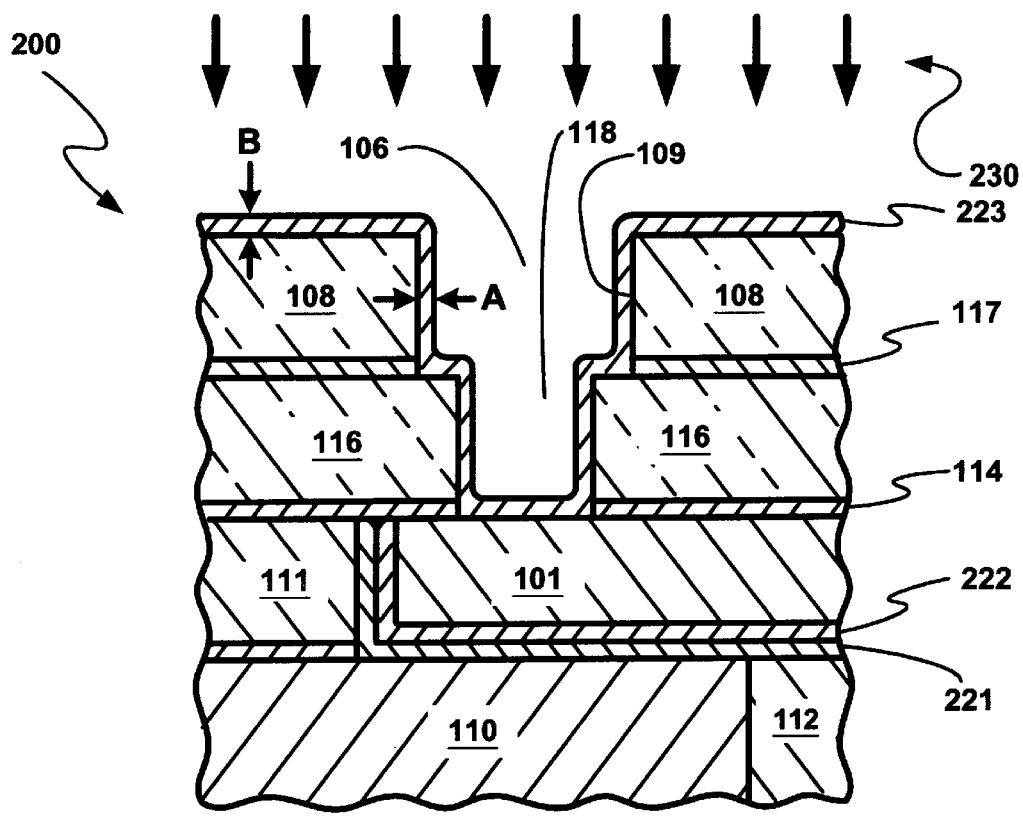
FIG. 3 is a cross-section of FIG. 1 (PRIOR ART) along line 2—2 during deposition of the barrier layer.

Referring now to FIG. 3, therein is shown a cross section of wafer 200 which utilizes part of the current invention. After the damascene process is used to form the first channel in the first channel dielectric 111, the barrier layer 221 is deposited by a high-pressure ionized metal deposition as will hereinafter be explained. This is followed by the high pressure metal deposition of the seed layer 222. The seed layer 222 is then filled with conductive material to form the first channel 101. FIG. 3 is shown after the dual damascene process and during the deposition of the seed layer 223 and prior to the filling of the second channel opening 106 and via 118 with the second conductive material. The same components as in FIG. 1 (PRIOR ART) and FIG. 2 (PRIOR ART) have the same reference numbers herein. The high pressure ionized metal deposition is shown by the arrows 230.

A common problem associated with ionized metal deposition, which is used for barrier and seed layer depositions, is poor sidewall step coverage. For example, the seed layer thickness is greater on wide-open areas, such as on top of the second channel dielectric layer 108 than on the sidewalls 109 of the second channel opening 106. The sidewall step coverage is defined as follows:

Sidewall step coverage=A/B where A is the thickness of the thinnest area of the seed layer 223 along the sidewalls 109 and B is the thickness of the seed layer 223 on top of the second channel dielectric layer 108. It is desirable to have high values in sidewall step coverage.

To guarantee a current minimum seed layer thickness of 10 nm anywhere in the channel opening 106, including at the lower portion of the sidewalls 109, the seed layer thickness in the wide-open areas tends to be much higher than 10 nm. Further, as the width of the channels and vias have decreased in size due to the size reduction in the semiconductor devices, an excessively thick seed layer in the upper portion of the sidewalls of the second channel opening 102 would interfere with the subsequent filling of the second channel opening 106 and via 118 with the second conductive material.

Figure 4:
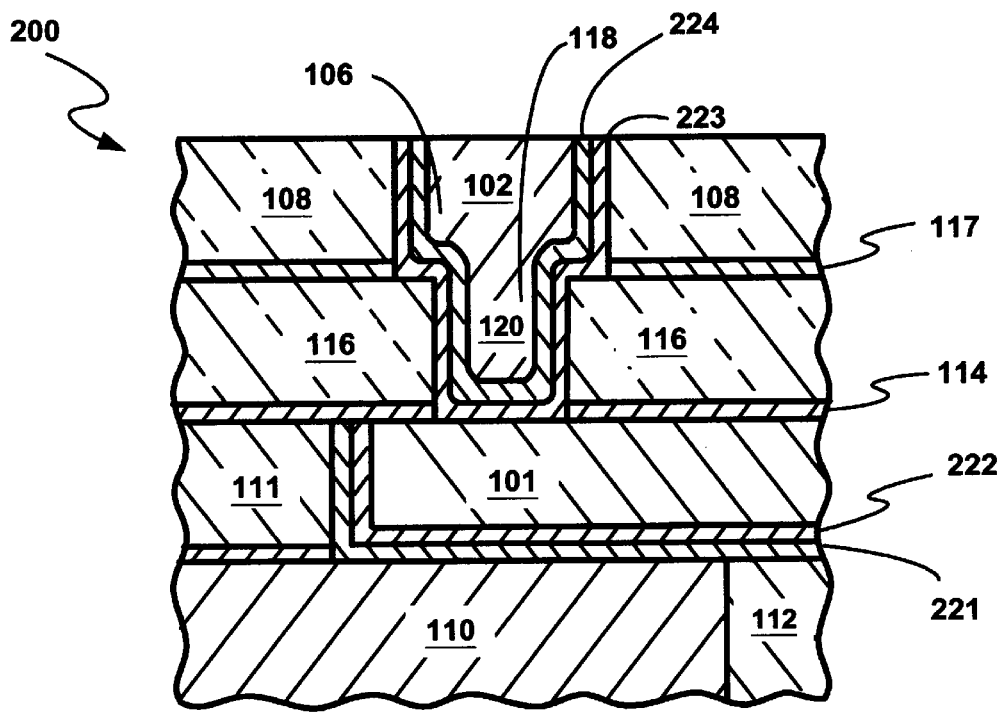
FIG. 4 is FIG. 3 after deposition of the seed layer and chemical-mechanical polishing.

Referring now to FIG. 4 therein is shown the cross-section of FIG. 3 after deposition of the barrier layer 224 and the conductive layer 118. For convenience of illustration, like reference numerals are used in FIG. 2 to denote like elements already described in FIG. 3. The barrier layer 224 is also deposited by high pressure ion metal deposition. The conductive layer 118 is deposited by conventional deposition techniques such as physical vapor deposition.

In production, a conventional first damascene process is used to dispose a first channel 101 in the first channel dielectric layer 111 above portions of a semiconductor device (not shown) on a production semiconductor wafer 100. The damascene process is a photolithographic process which uses a mask to define a first channel opening in the first channel dielectric layer 111. The first channel opening is then filled with the barrier layer 221, the seed layer 222, and a first conductive material, such as copper, to form the first channel 101 using conventional metal deposition techniques, such as physical vapor deposition, chemical vapor deposition, electroplating, or a combination thereof. The stop nitride layer 114, the via dielectric layer 116, and the via nitride layer 117 are then successively deposited on top of the first channel 101 and the first channel dielectric layer 111 using conventional deposition techniques.

By using the via photoresist and the via photolithographic process followed by nitride etching of a round via 104 in the via nitride layer 117, the basis for the cylindrical via 118 was formed. The subsequent deposition of the second channel dielectric layer 108 prepared the way for the second channel 106 to be perpendicular to the first channel 101.

The dual damascene process uses a further mask to define the second channel opening 106 in the second channel dielectric layer 108. Since the dual damascene process uses an anisotropic dielectric etch, the etch also forms the cylindrical via 118 down to the stop nitride layer 114. The anisotropic dielectric etch etches faster in the vertical direction of FIG. 3 than in the horizontal direction. The nitride etch of the stop nitride layer 114 exposes a portion of the first channel 101 and completes the etching steps.

Next, a thin barrier layer 223 is deposited in the second channel opening 106 and the cylindrical via 118, including along the walls of the second channel opening 106 and the cylindrical via 118. The thickness of the barrier material is insufficient to fill the second channel opening 106 and the cylindrical via 118. Examples of suitable barrier materials include titanium/titanium nitride, tantalum/tantalum nitride, tungsten/tungsten nitride, and combinations thereof.

The barrier layer is deposited using ionized metal deposition. Conventional ionized metal deposition is performed at low pressures from 20 mT up to 100 mT. The conventional flow rate at a constant pumping feed is below 100 standard cubic centimeters (sccm). The plasma coil (RF) power is about 2 kW. In the present invention, the ionized metal deposition is performed at high pressures above 100 mT. The flow rate at a constant pumping feed is above 200 sccm and the plasma coil power is between 3 kW and 5 kW to maintain ionization efficiency. Conventional art teaches that one cannot run current ionized metal plasma chambers used for integrated circuit processing at pressures above 100 mT because of rapid drop-off in ionization. To maintain ionization efficiency, a plasma coil power in the range of 3–5 kW needs to be applied. Applying 3–5 kW may cause the plasma coil to heat up. In order to prevent overheating of the plasma coil, active cooling through the center of the coil may be necessary to remove excess heat.

Thereafter, a thin seed layer 224 is deposited on the barrier layer in the second channel opening 106 and the cylindrical via 118. Again, the thickness of the seed layer 224 is insufficient to fill the second channel opening 106 and the cylindrical via 118. Examples of suitable seed materials include copper and copper alloys.

In the present invention, the ionized metal deposition for the seed layer 224 is performed at high pressures above 100 mT. The flow rate at a constant pumping feed is above 200 sccm and the plasma coil power is between 3 kW and 5 kW. This improves the step coverage of A/B for the seed layer 224.

Next, the second conductive material is deposited into second channel opening 106 and via 118 on top of the seed layer 224 using conventional metal deposition technique, such as physical vapor deposition, chemical vapor deposition, electroplating, electro-less plating or a combination thereof. Thereafter, a chemical mechanical polishing process is used to complete the conventional connection process similar to what were shown and described in FIG. 1 and 2.

While the best mode utilizes copper as the seed and conductive material, it should be understood that the present invention is applicable to other conductive materials such as aluminum, doped polysilicon, copper-base alloys, gold, gold-base alloys, silver, silver-base alloys, compounds thereof (including the nitrides), and combinations thereof.

Further, although the embodiments of the present invention are directed to using the single and dual damascene technique, it also will be recognized by those skilled in the art that other techniques of forming interconnect or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method of manufacturing a semiconductor device, comprising the steps of:

providing a semiconductor with a dielectric layer formed thereon, wherein said dielectric layer overlays a region on said semiconductor;

forming an opening in said dielectric layer, said opening defined by walls of said dielectric layer and exposing a portion of said region on said semiconductor;

depositing a metal layer over said dielectric layer and coating said opening by ionized metal plasma deposition at a pressure above 100 mT, said depositing said metal layer including depositing along said walls, said metal layer formed to a thickness insufficient to fill said opening; and forming a layer of conductive material in contact with said metal layer, said conductive material layer substantially filling said opening.

2. The method as claimed in claim 1 wherein said step of depositing said metal layer is performed at above 200 sccm total gas flow rate.

3. The method as claimed in claim 1 wherein said step of depositing said metal layer is performed at a deposition energy level above 3 kW.

4. The method as claimed in claim 1 wherein said step of depositing said metal layer provides a sidewall step coverage greater than the sidewall step coverage for an ionized metal plasma deposition at a pressure below 100 mT, the sidewall step coverage is defined to be A/B where A is the thickness of the thinnest area of said metal layer along said walls, B is the thickness of said metal layer on the uppermost surface of said dielectric layer.

5. The method as claimed in claim 1 including the steps of forming of said metal layer is performed with a material selected from a group comprising titanium, tantalum, tungsten, titanium nitride, tantalum nitride, tungsten nitride, and a combination thereof.

6. The method as claimed in claim 1 including the step of depositing a second metal layer over said metal layer and coating said metal layer by ionized metal plasma deposition at a pressure above 100 mT, said depositing said second metal layer including depositing along said walls, said metal layer formed to a thickness insufficient to fill said opening.

7. The method as claimed in claim 6 wherein said step of depositing said second metal layer is performed at above 200 sccm total gas flow rate.

8. The method as claimed in claim 6 wherein said step of depositing said second metal layer is performed at a deposition energy level above 3 kW.

9. The method as claimed in claim 6 wherein said step of depositing said second metal layer is performed with a material selected from a group comprising copper, aluminum, gold, silver, an alloy thereof, and a combination thereof.

10. A method of manufacturing a semiconductor device, comprising the steps of:

providing a semiconductor with a dielectric layer formed thereon, wherein said dielectric layer overlays a region on said semiconductor;

forming an opening in said dielectric layer, said opening defined by walls of said dielectric layer and exposing a portion of said region on said semiconductor;

depositing a barrier layer over said dielectric layer and coating said opening by ionized metal plasma deposition at a pressure above 100 mT, said depositing said barrier layer including depositing along said walls, said barrier layer formed to a thickness insufficient to fill said opening; and forming a layer of conductive material in contact with said barrier layer, said conductive material layer substantially filling said opening.

11. The method as claimed in claim 10 wherein said step of depositing said barrier layer is performed at above 200 sccm total gas flow rate.

12. The method as claimed in claim 10 wherein said step of depositing said barrier layer is performed at a plasma coil power level between 3 kW and 5 kW.

13. The method as claimed in claim 10 wherein said step of depositing said barrier layer provides a sidewall step coverage greater than the sidewall step coverage for an ionized metal plasma deposition at a pressure below 100 mT, sidewall step coverage is defined to be A/B where A is the thickness of the thinnest area of said barrier layer along said walls, B is the thickness of said barrier layer on the uppармost surface of said dielectric layer.

14. The method as claimed in claim 10 including the steps of forming of said barrier layer is performed with a material selected from a group comprising titanium, tantalum, tungsten, titanium nitride, tantalum nitride, tungsten nitride, and a combination thereof.

15. The method as claimed in claim 10 including the step of depositing a seed layer over said barrier layer and coating said barrier layer by ionized metal plasma deposition at a pressure above 100 mT, said depositing said seed layer including depositing along said walls, said barrier layer formed to a thickness insufficient to fill said opening.

16. The method as claimed in claim 15 wherein said step of depositing said seed layer is performed at above 200 sccm total gas flow rate.

17. The method as claimed in claim 15 wherein said step of depositing said seed layer is performed at a deposition energy level above 3 kW.

18. The method as claimed in claim 15 wherein said step of depositing said second metal layer is performed with a material selected from a group comprising copper, aluminum, gold, silver, an alloy thereof, and a combination thereof.

* * * * *